ns", J. Vac. Sci. Technol., vol. 10, pp. 1144–1149, (1973).

United States Patent [19]

Chapin et al.

[11] 4,166,784
[45] Sep. 4, 1979

[54] FEEDBACK CONTROL FOR VACUUM DEPOSITION APPARATUS

[75] Inventors: John Chapin; Charles R. Condon, both of Boulder, Colo.

[73] Assignee: Applied Films Lab, Inc., Boudler, Colo.

[21] Appl. No.: 900,996

[22] Filed: Apr. 28, 1978

[51] Int. Cl.² ............................................. C23C 15/00
[52] U.S. Cl. .......................... 204/192 R; 204/192 P; 204/298; 118/665; 118/715; 427/39; 250/565; 250/573
[58] Field of Search ......... 204/192 R, 192 C, 192 SP, 204/192 F, 192 P, 298; 118/49.1; 427/38–41

[56] References Cited

U.S. PATENT DOCUMENTS

| 3,738,926 | 6/1973 | Westwood et al. | 204/192 |
| 4,124,474 | 11/1978 | Bomchil et al. | 204/192 R |

FOREIGN PATENT DOCUMENTS

| 2422808 | 11/1975 | Fed. Rep. of Germany | 204/298 |
| 2232832 | 2/1975 | France | 204/192 R |

OTHER PUBLICATIONS

J. E. Greene et al., "Glow Discharge Optical Spectroscopy for Monitoring Sputter Deposited Film Thick- Primary Examiner—Aaron Weisstuch
Attorney, Agent, or Firm—Bruce G. Klaas; Dennis K. Shelton

[57] ABSTRACT

Method and apparatus for controlling vacuum deposition of a thin film onto a substrate, wherein the vacuum deposition produces a glow discharge. The glow discharge is monitored and light therefrom is converted to an electrical signal which is compared to a preset reference signal and used to optimize thin film properties by controlling deposition parameters such as current between electrodes or the supply of gas to a reactive sputtering apparatus. The overall intensity of the glow discharge, or the intensity of certain wavelengths, or the ratio of certain wavelength intensities may be monitored. The time derivative of the electrical signal may be taken to quicken response to light changes. The method and apparatus of the present invention are particularly applicable to reactive sputtering. As an alternative embodiment in reactive sputtering, cathode voltage may be monitored instead of the light.

27 Claims, 3 Drawing Figures

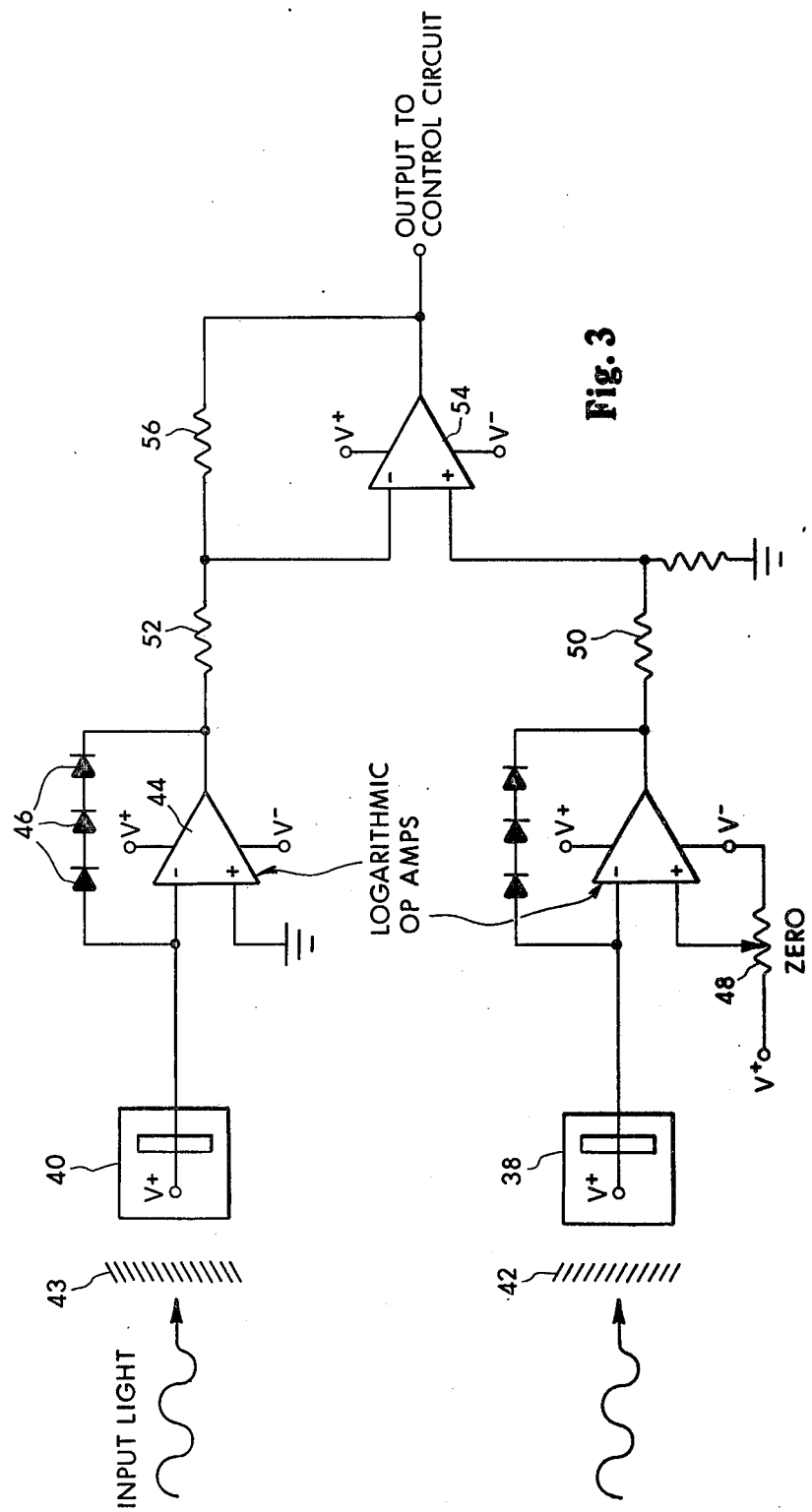

FEEDBACK CONTROL FOR VACUUM DEPOSITION APPARATUS

BACKGROUND OF THE INVENTION

The present invention relates to vacuum deposition of a thin film onto a substrate and, more particularly, to cathode sputtering.

Sputtering involves an evacuated vessel, or vacuum chamber, containing an anode and a cathode across which a potential drop is applied by a power supply. The cathode is either made of the material to be deposited or is overlaid with a target material to be deposited. The substrate, on which the thin film of material from the cathode is to be deposited, is affixed to the face of the anode or placed generally near the cathode. A relatively unreactive sputtering gas, such as argon, is introduced to the system. The electric field caused by the potential drop between electrodes causes the sputtering gas to break down into positive ions and electrons. The ions impact the cathode, causing atoms of the target material to be liberated therefrom, resulting in the deposition of material on the substrate. Thin films, typically less than 100 micrometers thick, are produced. A glow discharge occurs during deposition as a result of electrons produced at the cathode by positive ion bombardment. The electrons are driven toward the anode, thereby producing more electrons and producing more positive ions to bombard and erode the cathode. The electrons also excite gas atoms, gas molecules, and the sputtered atoms and particles in transit from the target to the substrate. As this excited matter falls back to lower energy states, photons are emitted. These photons are observed as the glow discharge.

A type of sputtering to which the present invention is particularly adaptable is known as reactive sputtering. In reactive sputtering, the inert sputtering gas is mixed with a small quantity of reactive gas. The gas chemically reacts with the surface of the cathode and with the film surface. In this manner, thin films of carbides, nitrides, oxides, hydrides, sulfides, etc. of target materials such as tantalum, aluminum, lead, silicon, Al-Si alloys, ferrites, chromium, beryllium, and germanium can be produced. This process can be employed with either the glow discharge apparatus described above, or with an rf sputtering arrangement as is known in the art. Reactive sputtering is potentially particularly advantageous for use in producing thin films, but a major disadvantage has been the difficulty in controlling the composition of the products. The product films desired in reactive sputtering are frequently those which are "intermediately reacted", that is, they are not reacted to their full extent as would be indicated by their valence.

For example, an intermediately reacted film of silicon oxide can be formed by sputtering silicon in a small pressure of oxygen. A target plate of the element silicon is attached to a cathode assembly, a high vacuum is obtained, a small pressure of argon gas is introduced, and a negative potential of several hundred volts is applied to the cathode. A glow discharge results and a dark, metallic, amorphous, semiconducting film condenses on a substrate placed near the cathode. One desirable property is a certain index of refraction, n, for some optical application, such as in an anti-reflecting film on a silicon photo-voltaic cell. If a small pressure of oxygen is added, a brown insulating film is obtained, and, if a greater oxygen pressure is added, a clear insulating film results. These films are generally described by the notation $SiO_{(2-X)}$, where $SiO_2$ is generally accepted as the completely oxidized compound and X between zero and two indicates the lack of oxygen in the suboxidized compound. The following values for an intermediate SiO compound are reported by K. L. Chopra, Thin Film Phenomena, 1969, McGraw Hill, p. 750:

Table I

| Compound | X | n | Wave length (microns) |
|---|---|---|---|
| Si | 2 | 3.3 | 2.0 |
| SiO | approx. 1 | 1.55–2.0 | 0.55 |
| SiO | approx. 1 | 1.5–1.8 | 2.0 |
| $SiO_2$ | 0 | 1.44 | 0.55 |
| $SiO_2$ | 0 | 1.46 | 2.0 |

Clearly, the control of desirable film properties requires close control of the amount of oxygen added to the sputtering vessel. Another example of close control is the formation of titanium carbide, $TiC_{(1-X)}$, by sputtering titanium metal in the presence of argon and methane ($CH_4$). (Titanim hydride decomposes above 400° C., so the substrate may be heated to inhibit hydride formation.) Titanium carbide is known to exhibit a range of mechanical properties such as hardness over its range of X (0 to 1), making close control of the extent of reaction again desirable.

A number of drawbacks are inherent in prior art devices for controlling vacuum deposition. E. Kay, in U.S. Pat. No. 3,354,074, suggests the use of a "film thickness profile" to test the uniformity of film growth. This technique relies on preselected control settings. Another prior art device employs a feedback controlled power supply with a thickness and rate control system in which a quartz crystal oscillator is located near the target so that film is deposited on the crystal's front electrode. The mass of film added to the crystal's front electrode changes the crystal's oscillation frequency. This frequency change is measured and correlated to film thickness. By taking the time derivative electronically, the deposition rate is obtained. Another prior art device for control of vapor deposition systems is an automatic pressure controller. This device is an electromechanical instrument designed to regulate the pressure or gas flow in a vacuum system. The output from a pressure transducer is usually the input to the controller, which in turn controls a servo driven valve or a piezoelectric valve. The servo driven valve itself has a very slow response time. The quartz crystal oscillator and the piezoelectric valve both diminish in stability as response time is reduced, making them only marginally suitable. The quartz crystal oscillator also has a limit on the mass of film which can be added to it, eliminating the use of the quartz crystal in many production applications.

Control devices must have extremely fast response times to be useful in reactive sputtering, since, in most types of reactively sputtered films, the sputtering rate of the elemental or alloy target is much greater than the sputtering rate of the reactively formed compound. During sputtering, a small amount of the reactive gas flowing through the system reacts with portions of the cathode or target surface. If the gas is used up in the reaction, the reactive gas pressure remains low, and the reacted surfaces may be small enough in area that the overall sputtering rate is not affected substantially. However, if gas is introduced to change the elemental ratio of the film compound, enough reactive gas may also be introduced to react at the cathode surface and substantially decrease the sputtering rate. Then, the amount of gas used up in the reaction also decreases. The reactive gas pressure can then increase and can react with more of the surface thus decreasing the sputtering rate more, until the desired elemental ratio is bypassed.

For example, if a metal (M) is being sputtered in the presence of oxygen, the system may be on the metallic edge of the ratio of M to O in the desired intermediate compound. That is, the ratio of M to O may be too high. If the oxygen pressure is increased to obtain the desired intermediate ratio, the increase in oxygen pressure causes more reaction but also causes a decrease in sputtering rate. The decrease in sputtering rate causes less of the oxygen to be used in the reaction and further increases the oxygen pressure, thus forming a cycle beginning with the original increase. This cycle continues until the system is on the oxidized side of the desired ratio, typically in a fraction of a second. Decreasing the oxygen pressure results in a similar reverse cycle until the system is on the metallic side of the desired ratio. The desired intermediate ratio may then be at a point that is impossible to reach by ordinary pressure control apparatus. This cycle of fluctuation represents a basic instability in the region where the desired degree of reaction occurs. The instability becomes more prevalent in a production type of system where a large amount of material is being sputtered.

In producing intermediate films, attempts have been made to circumvent the control problem altogether. For instance, Gillery, in U.S. Pat. No. 3,907,660, describes a process in which the substrate is heated to 204° to 316° C. to inhibit information of the completely oxidized indium-tin film. This process, however, reduces the desirable quality of uniform etchability in the film coating. Other coating methods are described in the background section of the Gillery patent.

SUMMARY OF THE INVENTION

A control device for an apparatus having a glow discharge is provided which can overcome the basic instability of reactive sputtering by a rapid response time. The device measures the light intensity of the glow discharge, which is related to the rate of sputtering, and to the degree of reaction in reactive sputtering.

The control device comprises converting means, such as a photocell, for converting the light intensity of the glow discharge into an electrical signal, comparing means, comprising a conventional electronic comparator, for comparing the electrical signal to a reference signal preset for known optimum conditions, and adjusting means, such as a solenoid operated gas vent valve, for adjusting the rate of the deposition or of the reaction in response to the comparing means.

The converting means may be sensitive to overall intensity, to the intensity in a narrow range of wavelengths, or to a ratio of the intensities of light of selected wavelengths. Logarithmic and difference operational amplifiers are used for obtaining the ratio of wavelengths.

The comparing means may comprise a derivative operational amplifier to provide a phase lead and, therefore, earlier response by the control circuit. The derivative of the electrical signal is added to the signal by an addition operational amplifier and the output is compared to a reference signal in a comparator.

An alternative embodiment may be employed in certain reactive sputtering arrangements where the target material and the reaction product have differing observed cathode voltages. Then, the cathode voltage may be measured and used for converting means to supply the electrical signal to the comparing means.

BRIEF DESCRIPTION OF THE DRAWING

FIG. 3 is a block diagram of a color sensor, or converting means which compares two wavelengths.

DESCRIPTION OF THE PREFERRED EMBODIMENT

Figure 1:
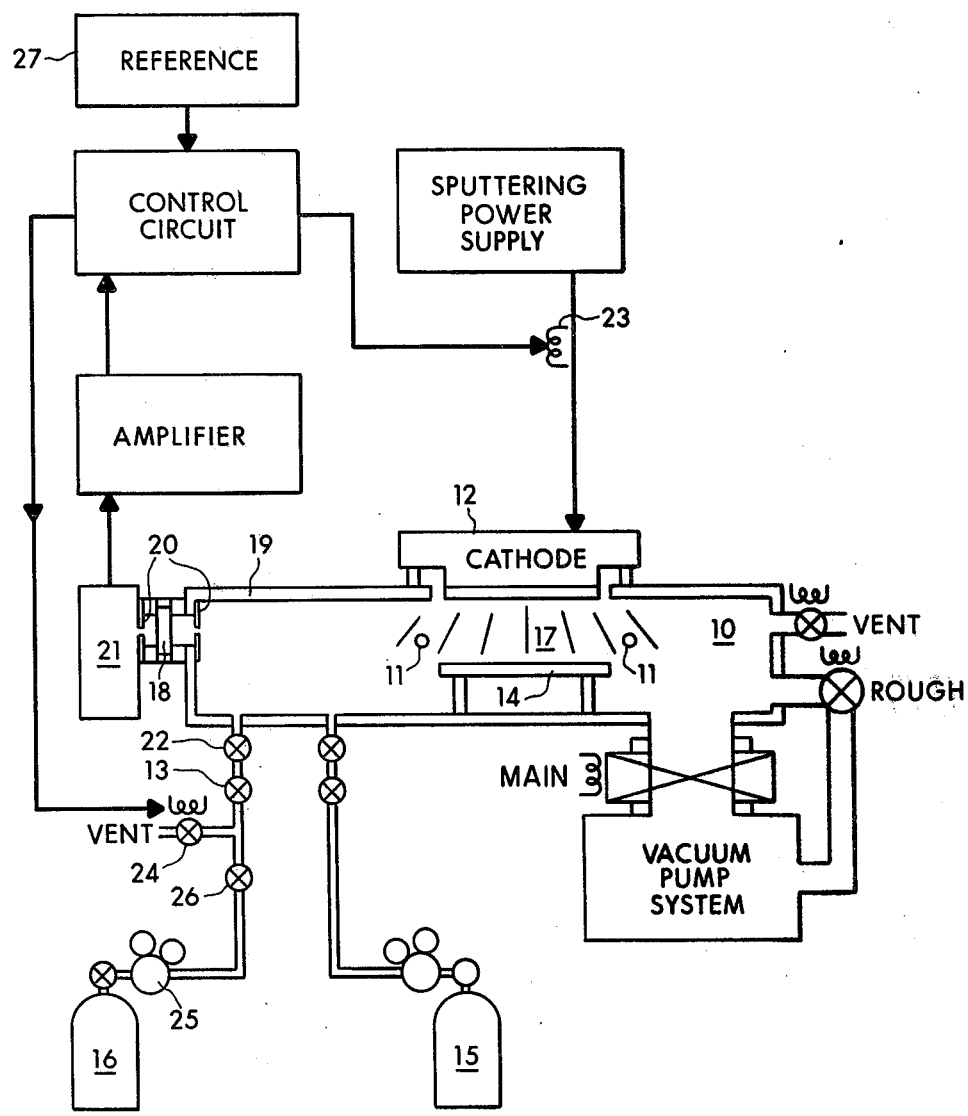
FIG. 1 is a schematic diagram of the control device of the present invention.

The present invention makes use of the correlation between the glow discharge in an evaporation or sputtering apparatus and the rate of film deposition. In general, when the sputtering rate is lowered, the amount of the material in the glow discharge between the target and the substrate is decreased. Accordingly, the light caused by the discharge exciting that material is also lowered in intensity.

In particular, the overall intensity and the intensity of various wavelength components of the light from the glow discharge have been found to be indicative of the degree of reaction at the film surface in reactive sputtering, or in reactive evaporation. Once a film with the desired properties has been obtained, the same reference setting on the deposition system can be used for the next film production to obtain the same reaction product and thereby maintain uniformity of results.

In reactive sputtering, if little or none of the reactive gas, oxygen for example, is present, the light from the discharge is mainly a characteristic of the sputtering gas, usually argon, and the sputtered element or material. When copper is sputtered at high rates, for example, the light is green. Titanium and indium produce blue and chromium produces a beautiful blue-green. The *CRC Handbook of Chemistry and Physics*, 55th Ed., 1974–75, CRC Press, gives strong spectral lines which correspond to these colors:

| | CRC REPORTED LINE | |
|---|---|---|
| Element | Wavelength (angstroms) | Color Observed |
| Cu | 5218 | Green |
| Cr | 4254 | Deep Blue |
| Cr | 5206 | Green |
| In | 4511 | Deep Blue |
| Ti | 4981 | Blue/slight green |
| Sn | 3175 & 4525 | Faint Blue |
| O | 1304 & 7772 | White to Pink |

If a reactive gas such as oxygen is introduced, the reactive gas reacts with the very clean surface of the cathode target, producing the compound, and in general the sputtering rate of the compound produced is different and usually much lower. For example, aluminum oxide sputters roughly 40 times slower than aluminum metal; silicon dioxide, about 8 times slower than silicon; and indium-tin-oxide, about 10 times slower than indium-tin alloy for equal sputtering powers. Again, since the amount of the element in the glow discharge between the target and the substrate is decreased, the light caused by the discharge exciting that element is usually much less intense. Another change when the reactive gas is introduced is that light from the compound in the discharge is produced, although a portion of the compound may be broken down back into its constituent elements by the action of the sputtering and the discharge. Also, light characteristic of the reactive gas is produced.

Due to the above described effects, the intensity of the light from the glow discharge is a good indicator of the degree of reaction at the cathode target surface. Since the thin film being deposited is also a very clean surface like the eroded target surface, and since the thin film surface is exposed to almost exactly the same reactive atmosphere as the cathode target surface, the light from the glow discharge is a relative indicator of the degree of reaction of the thin film.

The present invention is particularly adapted for deposition of films of suboxidized indium-tin-oxide (ITO), which are transparent to visible light and electrically conductive. These films are reflective in the infrared spectrum (2.5 microns to at least 16 microns), in the microwave region at $1.2 \times 10^5$ microns (2.45 GHZ), and are known to be used as reflectors in the radio frequency spectrum. ITO films are useful in visible windows which shield by reflecting any of the above mentioned spectrum of wavelengths. They are also useful as transparent electrical conductors in gas discharge displays, liquid crystal displays, and some types of cathode ray tube displays.

An intermediate degree of oxidation is desirable for ITO films for many reasons: If the film is too metallic, it will have low visible transparency, it will tend to be soft and easily scratched, it may not have as high an electrical conductivity as obtainable, it may not have as high an infrared reflectivity as obtainable, it will tend to have metallic occlusions, and it will tend to craze and peel off a glass substrate with subsequent heat treatments. Subsequent heat treatments may be necessary to optimize the properties of the ITO film, to process the glass substrate, or to process other films. If the ITO film is too oxidized or completely oxidized it will have good transparency, but poor conductivity and it will be sputtered at a slower rate than the intermediate oxide. At a constant sputtering power, deposition rates of 550 Å/min for a fully oxidized film, 2900 Å/min for a typical good quality intermediately oxidized film, and 5300 Å/min for a metallic film are obtained. Additionally, an ITO film deposited on glass at an ambient temperature of about 25° C., which rises only slightly during the deposition is inherently easily and uniformly etchable in dilute hydrochloric acid. The heat treated films are much more difficult to etch and do not etch as uniformly.

A presently preferred embodiment of the vacuum deposition apparatus of the present invention is shown in FIG. 1. A vacuum chamber 10 contains a conventional anode 11 and a cathode 12. The presently preferred cathode is of the cooled, planar type known in the art and described in Canadian Pat. No. 1,014,519 and "The Planar Magnetron", *Research/Development*, p. 37, January 1974, both of which are incorporated herein by reference. The anode 11 may be made of any conductive, heat resistant material, such as aluminum, or copper, or the chamber itself may act as the anode. The material to be sputtered is comprised in, or affixed to, the cathode, and may be any material known to be suitable for such use, such as, for instance, cadmium, indium, tin, antimony, or mixtures thereof, such as tin-antimony alloy, as well as aluminum, tantalum, chromium, beryllium, germanium or silicon. Hydrocarbon molecules can also be decomposed in the presence of a glow discharge and condensed as polymer films.

A sputtering power supply is connected to the anode and cathode and applies a voltage potential between them, e.g. 700-900 V. The power source may be d.c. or a.c. with rectifying circuitry. The present invention is also adaptable to rf sputtering. The preferred sputtering power supply is saturable reactor controlled, and operating in the constant current mode. Typical outputs are up to 1200 DCV and up to 12 A or more. Since a planar magnetron tends to be a constant voltage device, the constant current supply gives a very stable current-voltage product or power condition.

The substrate to be coated moves by the cathode 12 on a carrier table 14. The substrate may be a transparent ceramic, such as glass, or a metal, a plastic, or other materials.

Means for producing reduced pressure is provided by a vacuum pump system used to evacuate the chamber 10 to a suitable operating pressure, preferably $10^{-4}$ to $10^{-7}$ torr ($10^{-2}$ to $10^{-5}$ Pa). A conventional vacuum pump system with solenoid controlled rough and main valves is used.

A supply of sputtering gas is provided by a gas container 15, containing a relatively inert gas such as argon, krypton, etc., the container being connected through suitable valves to the chamber 10. A gas container 16 provides a supply of reactive gas, such as oxygen, connected through a throttle valve 26, to the vacuum chamber 10. The reactive and sputtering gases may also be mixed before entering the chamber.

During sputtering, a glow discharge 17 appears adjacent to the cathode 12. In planar magnetron sputtering, the cathode dark space is very short (less than 1 cm) and the negative glow is concentrated near the dark space edge. The cathode glow, in this particular type of sputtering, is thus more suitable for measurement than anode glow, which appears to be rather variable. Other types of sputtering may be amenable to anode glow measurement, however. The light from the glow discharge passes through a glass window 18 in the vacuum chamber wall 19 and through a pair of slits 20 which serve to minimize the effect of the moving substrate and reflections therefrom which might affect the light intensity and further serve to prevent the glass window from being coated. A photocell 21 receives the light passing through slits 20 and converts the light to an electrical signal proportional to the light intensity. A suitable photocell is a Densichron I produced by Sargent Welch, which is sensitive over the visible spectrum. A fast response type of cadmium sulfide cell sensitive from 5500 Å to the ultraviolet is also useful. A photomultiplier tube may also be employed. The signal from the photocell is processed by a d.c. current amplifier which outputs to a control circuit.

Figure 2:
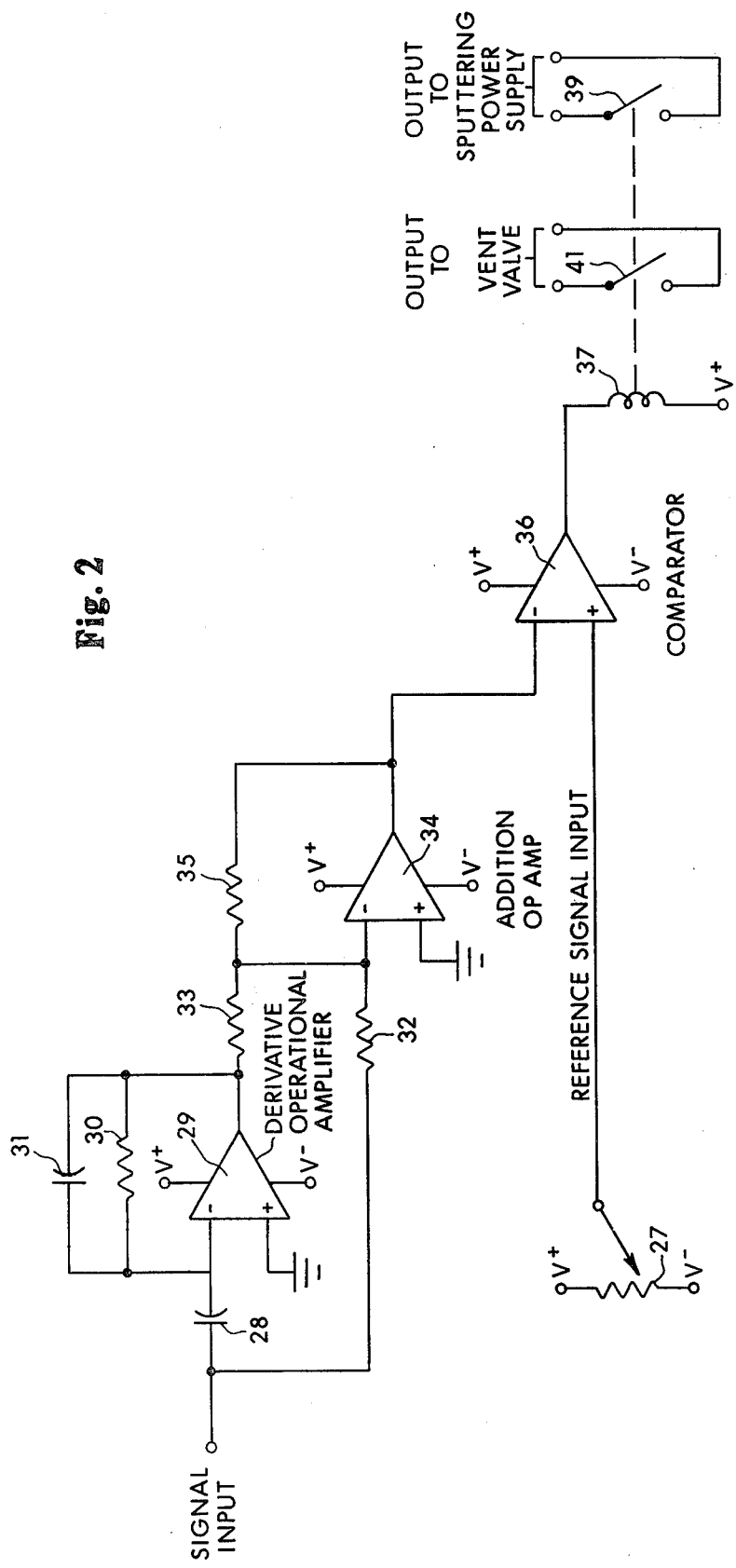
FIG. 2 is a block diagram of a control circuit of a comparing means of the control device.

The control circuit adds the time derivative of the light-proportional electrical signal as a control lead to the signal itself, compares the sum to a reference level and produces an output going to adjusting means such as a sputtering power supply control 23 and a solenoid vent valve 24. The sputtering power supply control 23 may be a relay switch, as shown in FIG. 2, which causes the current to the control winding of the saturable reactors of the power supply to vary by a small amount, about 15%, by a resistor in series with that control winding. Many other ways of controlling the power supply are possible.

The solenoid vent valve 24 is located between the reactive gas supply 16 and the vacuum chamber 10 and vents the reactive gas outside the chamber. If the output from the control circuit indicates excess oxygen, the sputtering power is increased through control 23 and the solenoid vent valve 24 is opened to reduce the flow of oxygen to the vacuum chamber 10. The film being sputtered would then tend towards the metallic state. To increase oxidation, the solenoid vent valve is closed and the sputtering power is decreased. An oxygen shut off valve 13 may also be located between the solenoid vent valve 24 and the vacuum chamber to facilitate pump-down. A standard metering valve 22 is located just upstream of the chamber inlet and downstream of the input vent valve 13. The solenoid vent valve 24 is located upstream of the oxygen metering valve 22 and downstream of a gas regulator 25. The reactive gas pressure in the line at the oxygen metering valve 22 is maintained either at near atmospheric pressure or by a gas regulator 25, depending on whether the vent valve is opened or closed respectively. The gas regulator 25 is located between the gas supply 16 and the vent valve 24. A throttle valve 26 may be interposed between the gas regulator 25 and the vent valve 24 to prevent waste of reactive gas and to lower the audible noise level. This vented valve arrangement has a very fast response time and helps to prevent large oscillations in sputtering conditions.

The control circuit, which controls the gas flow and power supply, provides the comparing means by which the electrical signal from photocell 21 is compared to a preset reference signal provided by a reference source 27, such as a potentiometer from the voltage source for the operational amplifiers, having means for preselecting a reference signal output. The comparison signal which is obtained is used to adjust sputtering parameters.

Referring now to FIG. 2, a control circuit is shown wherein the amplified signal input passes through a conventional differentiating circuit, comprising a capacitor 28 connected to a conventional operational amplifier ("op amp") 29 having a resistor 30 connected in parallel with it. Capacitor 31 is connected in parallel with resistor 30 to reduce sensitivity to high frequency noise which might be produced by momentary cathode arcs, photocell noise, or relay contacts. The output from the differentiating circuit and the input signal are connected through input resistors 33, 32, respectively, to one input terminal of an operational amplifier 34. The input resistors 32, 33, together with a resistor 35 connected in parallel with the op amp 34 form a conventional addition or summing circuit. There, the derivative of the input signal is added to the input signal itself to produce a summed signal having a phase lead, or early response, to help make up for the slow response of other elements in the control loop. The earlier response helps reduce the magnitue of oscillations in the sputtering conditions.

The summed signal and a reference signal, typically chosen by the system operator, are input to the respective inverting (negative) and non-inverting (positive) input terminals of a conventional comparator consisting of an op amp 36, only. $V^+$ and $V^-$ represent a common power supply for the op amps and reference signal. The comparator yields a signal close to $V^+$, if the summed signal is less than the reference signal, and close to $V^-$ if greater, turning relay 37 off and on respectively. A slight difference between the summed signal and the reference signal will be amplified by the comparator op amp 36 by a gain factor of about $10^4$. For instance, if the input signals differ by 1mV, then the output to relay 37 would be 10v, assuming that $V^+$ and $V^-$ are greater in magnitude than 10 volts. Relay 37 operates an output switch 41 to the vent valve and an output switch 39 to the sputtering power supply.

Referring now to FIG. 3, a converting means and amplifier are shown which are sensitive to color changes but not to overall intensity changes of the glow discharge light. This converting means may be employed in place of the single photocell 21 in FIG. 1. By color changes, it is meant changes in the spectral composition of the light, whether the light is visible, infrared, ultraviolet, or in other ranges of the electromagnetic spectrum. A color sensitive circuit has been found to be advantageous, for example, when the sputtering power is changed between sputtering operations. Changing this power level changes the overall light intensity at which optimum films are obtained, causing error in the preselected optimum reference. However, the ratio of the intensity of the light in one part of the spectrum to the intensity of the light in another part of the spectrum has been found to change only slightly for optimum ITO films, even when the sputtering power, and therefore total light intensity, is changed by factors up to three.

The ratio of the intensity of light of two different wavelengths (actually the logarithm of the ratio) is taken electronically by taking the logarithim of the two light sensor signals and subtracting them. This difference then is a very suitable input for the control circuit described above. The antilogarithm could be taken to obtain the true ratio, but this is not necessary.

A color sensitive converting means for converting a ratio of light intensities to an electrical signal comprises a first photoelectric sensor 38 and a second photoelectric sensor 40, which may be mounted in the apparatus in a manner similar to photocell 21 in the apparatus of FIG. 1. Each photocell is made sensitive only to light of a particular wavelength or wavelengths, as by passing the light through different filters 42, 43 or by refraction or diffraction elements, or by use of a monochromometer. The first electrical signal from the first photocell and the second electrical signal from the second photocell are input to first and second logarithmic operational amplifiers. Each logarithmic op amp comprises an operational amplifier 44 with 3 serially connected diodes 46 connected in parallel with the amplifier. A diode has been found to be more reliable than the transistor known for use in the log op amp loop. Multiple diodes in series increase the gain of the log op amp. The second logarithmic op amp comprises an arrangement similar to the first with the addition of a potentiometer 48 to ground for zeroing. A zero adjustment is necessary to bring the output of the difference op amp 54 on scale between $V^+$ and $V^{31}$. The outputs from the logarithmic op amps are passed through resistors 50, 52 and into the positive and negative input terminals, respectively, of a subtracting circuit or difference op amp comprised of an operational amplifier 54 having a resistance 56 connected in between the negative input and the output. The input resistors 50, 52 are selected for optimum op amp 54 gain.

When a reactive sputtering apparatus is used, an alternative embodiment of the present invention may be used in place of the converting means for converting light intensity into an electric signal. The electrical signal to the control circuit, or comparing means, may be made proportional to the observed cathode voltage by means of a resistance divider which reduces the cathode voltage (e.g. 150-900 v. with a planar magnetron) to a level (e.g. 0.1-20 v.) which can be managed by the control circuit.

The cathode voltage is an indicator of the degree of reaction because the cathode voltage is sensitive to secondary electron emission from the cathode target surface, i.e., electrons emitted because of ion bombardment. This electron emission is sensitive to the surface condition. Oxide compounds, for example, generally have more emission than their metal constituents, and, as they are formed on the target surface, will affect the cathode voltage. Silicon, for example, has an observed cathode voltage of about 700 volts versus about 200 volts when silicon dioxide is on the target surface. The cathode voltage has been found to be a good indicator of degree of reaction in this case. Indiumtin alloy is about 385 volts and the oxide is about 360 volts. Unfortunately this is a fairly small range, and the function is double valued. At one cathode voltage there are two different degrees of reaction from about 385 to 420 volts. The cathode voltage difference, to be a useful indication of the degree of reaction, preferably should be large, monotonic, and single valued. Thus, the In-Sn-O composition is considered impractical for use in this method. The Si-O, Mg-O, and Al-O compositions have been found to be amenable to this system, and the Ti-O composition has been found to be marginal.

While particular embodiments of the inventive concepts have been illustratively disclosed herein, it is to be understood that many of the inventive concepts may be carried out by other electronic or optical components and applied to other vacuum deposition processes than those particularly described. For instance, the features described with regard to reactive sputtering may be applied to reactive evaporation, wherein a glow is produced in the electron path between the emitter to the crucible of an electron beam evaporator. Thus, it is intended that the appended claims be construed to include alternative embodiments except insofar as limited by the prior art.

What is claimed is:

1. In an apparatus for depositing an intermediately reacted thin film onto a substrate, said apparatus having a chamber, a power supply, means for providing a flow of reactive gas to the apparatus, and producing a glow discharge having light intensity, a control device comprising:
    converting means for converting the light intensity of the glow discharge into an electrical signal indicative of the light intensity;
    comparing means for comparing the electrical output signal to a reference signal to obtain a comparison signal;
    adjusting means for rapidly adjusting said flow of said reactive gas to said apparatus by venting said gas outside said chamber in response to said comparison signal to control the depositing of said intermediately reacted thin film.

2. The apparatus of claim 1 wherein said comparing means comprises:
    an amplifier, connected to said converting means, for amplifying said electrical signal;
    a differentiating circuit connected to said amplifier, for taking the time derivative of said electrical signal;
    an addition circuit connected to said differentiating circuit for adding the time derivative of the electrical signal to the electrical signal to obtain a summed signal; and
    a comparator, connected to said addition circuit and inputting said reference signal, for comparing the summed signal to said reference signal to produce said comparison signal.

3. The apparatus of claim 1 wherein said adjusting means further comprises:
    means for adjusting said power supply in response to said comparison signal.

4. The apparatus of claim 1 wherein said converting means for converting light intensity to an electrical signal comprises:
    a first photoelectric sensor producing a first electric signal in proportionate response to light of a first wavelength, said light being received from said glow discharge;
    a second photoelectric sensor producing a second electric signal in proportionate response to light of a second wavelength, said light being received from said glow discharge; and
    means for comparing the first electric signal to the second electric signal and outputting to the adjusting means.

5. The converting means of claim 4 wherein said means for comparing the first electric signal to the second electric signal comprises:
    a first logarithmic amplifier, connected to the first photoelectric sensor, for producing a first logarithmic output of the first electric signal;
    a second logarithmic amplifier, connected to the second photoelectric sensor, for producing a second logarithmic output of the second electric signal; and
    a subtracting circuit for subtracting the first logarithmic output from second logarithmic output and outputting the difference to the comparing means.

6. The apparatus of claim 5 wherein said first logarithmic amplifier and said second logarithmic amplifier comprise serially connected diodes between an input and an output of an operational amplifier.

7. In an apparatus for reactive sputtering, said apparatus producing a glow discharge and comprising an anode, a cathode, a power supply for creating a potential drop between the anode and the cathode, a cathode adapted to comprise a target material, means for supporting a substrate to be coated, means for producing reduced pressure in the apparatus, means for providing a sputtering gas, a means for providing a flow of reactive gas to the apparatus, said reactive gas reacting with said target material to form an intermediately reacted product, the improvement comprising:
    converting means for converting the light intensity of the glow discharge into an electrical signal proportional to the light intensity;
    comparing means for comparing the electrical signal to a reference signal to obtain a comparison signal;
    said comparing means comprising differentiating means for obtaining a comparison signal having a phase lead; and
    adjusting means for adjusting said flow of reactive gas in response to said comparison signal.

8. The apparatus of claim 7 wherein said reactive gas is oxygen.

9. The apparatus of claim 7 wherein the target material is selected from the group consisting of silicon, indium-tin alloy, tin-antimony alloy, and aluminum.

10. The apparatus of claim 7 wherein said converting means comprises means for converting the light intensity of light of a first wavelength to a first signal and the light intensity of light of a second wavelength to a second signal and means for comparing said first signal and said second signal to produce said electrical signal proportional to the ratio of the light intensity of the first wavelength and the second wavelength.

11. The apparatus of claim 7 wherein said adjusting means comprises a vent valve for venting said reactive gas to the atmosphere.

12. The apparatus of claim 11 further comprising a metering valve downstream of said vent valve.

13. In a process for coating an article by reactive sputtering in a sputtering apparatus including a chamber, an anode, a cathode, means for providing a flow of reactive gas, and a sputtering power supply, said apparatus emitting a glow discharge having a light intensity, the improvement comprising:
   (a) converting the light intensity of the glow discharge into an electrical signal proportional to the light intensity;
   (b) comparing the electrical signal to a reference signal to obtain a comparison signal; and
   (c) adjusting the flow of said reactive gas in rapid response to said comparison signal by venting said gas outside said chamber to a rate which produces an intermediately reacted compound.

14. The process of claim 13 further comprising the steps of:
   (a) amplifying said electrical signal;
   (b) taking the time derivative of the electrical signal;
   (c) adding the time derivative of the electrical signal to the electrical signal to obtain a summed signal; and
   (d) comparing the summed signal to said reference signal to obtain said comparison signal.

15. The process of claim 13 wherein said adjusting the flow of reactive gas comprises the step of:
   venting said reactive gas outside the apparatus to reduce the flow thereof.

16. The process of claim 13 wherein said converting of the light intensity to an electrical signal comprises the steps of:
   (a) converting the light intensity of light of a first wavelength band to a first electrical signal;
   (b) converting the light intensity of light of a second wavelength band to a second electrical signal; and
   (c) comparing the first electrical signal to the second electrical signal.

17. The process of claim 16 wherein said comparing of the first electrical signal to the second electrical signal comprises the steps of:
   (a) taking a logarithim of the first electrical signal;
   (b) taking a logarithim of the second electrical signal; and
   (c) subtracting the logarithim of the first electrical signal from the logarithim of the second electrical signal.

18. The process of claim 13 wherein said reactive gas is oxygen.

19. The process of claim 18 wherein said cathode target material consists essentially of indium-tin alloy.

20. The process of claim 19 wherein said article is transparent ceramic.

21. The process of claim 13 wherein said sputtering process comprises the step of:
   coating an unheated article.

22. The process of claim 13 wherein said cathode comprises unreacted material which sputters at a relatively high rate compared to said intermediately reacted compound.

23. In a method for coating an article in a reactive sputtering apparatus including an anode, a cathode and a sputtering power supply, wherein a flow of reactive gas is added to the apparatus to react with material from a target on the cathode surface to form a compound, the improvement comprising:
   (a) selecting a target material with a first observed cathode voltage having a measurable difference from an observed cathode voltage of said compound;
   (b) measuring the cathode voltage during said reactive sputtering to obtain an electrical signal;
   (c) comparing the electrical signal with a reference signal to obtain a comparison signal; and
   (d) adjusting the rate of said sputtering in response to said comparison signal.

24. The method of claim 23 further comprising the steps of:
   (a) amplifying said electrical signal.
   (b) taking the time derivative of the electrical signal;
   (c) adding the time derivative of the electrical signal to the electrical signal to obtain a summed signal; and
   (d) comparing the summed signal to said reference signal to obtain said comparison signal.

25. The method of claim 23 wherein said adjusting the rate of said sputtering comprises the step of:
   venting said reactive gas outside the apparatus to reduce the flow thereof.

26. The method of claim 25 wherein said reactive gas is oxygen.

27. The method of claim 23 wherein said cathode consists essentially of a member of the group consisting of indium-tin alloy, tin-antimony alloy, silicon, magnesium, and aluminum.

* * * * *